United States Patent
Lo

(10) Patent No.: US 6,204,581 B1
(45) Date of Patent: Mar. 20, 2001

(54) COMMUTATOR HEAT DISSIPATING DEVICE FOR ALTERNATORS

(76) Inventor: Shih-Kaung Lo, 5F-23, 70, Fu-Shing Road, Taoyuan (TW)

( * ) Notice: Subject to any disclaimer, the term of this patent is extended or adjusted under 35 U.S.C. 154(b) by 0 days.

(21) Appl. No.: 09/316,952

(22) Filed: May 24, 1999

(51) Int. Cl.[7] .............................. H02K 11/00; H02M 7/44; H02M 1/00
(52) U.S. Cl. ......................... 310/68 D; 363/141; 363/145
(58) Field of Search .................... 310/68 D, 71; 363/141, 144, 145; 361/697, 703, 709; 411/373

(56) References Cited

U.S. PATENT DOCUMENTS

| | | | |
|---|---|---|---|
| 3,609,428 | * 9/1971 | Cotton et al. | 310/68 D |
| 3,866,072 | * 2/1975 | Nagai | 310/68 D |
| 5,424,594 | * 6/1995 | Saito et al. | 310/68 D |
| 5,451,823 | * 9/1995 | Deverall et al. | 310/68 D |
| 5,828,564 | * 10/1998 | Mori et al. | 363/141 |
| 5,866,963 | * 2/1999 | Weiner et al. | 310/68 D |
| 5,991,184 | * 11/1999 | Russell et al. | 363/145 |

* cited by examiner

Primary Examiner—Nestor Ramirez
Assistant Examiner—Dang Dinh Le
(74) Attorney, Agent, or Firm—Dougherty & Troxell

(57) ABSTRACT

An improved commutator heat dissipating device for alternators, the commutator including a heat dissipating plate, a base plate, a top cover, terminals, and diodes. The heat dissipating plate has a body including a plurality of recesses for receiving the diodes, and a plurality of integrally connected wavy cooling fins on an opposite side thereof. An insulation plate is disposed between a bottom side of the body and the base plate. Securing posts pass through through holes in the heat dissipating plate to secure the heat dissipating plate and the base plate. The terminals include insulating elements and conductive plates. The insulating elements are capable of positioning the terminals by means of limiting blocks and posts of the heat dissipating plate to enable the conductive plates to be soldered with the diodes. The commutator has excellent heat dissipating effects and enhanced structural strength to achieve smooth operation of machine elements.

3 Claims, 5 Drawing Sheets

COMMUTATOR HEAT DISSIPATING DEVICE FOR ALTERNATORS

BACKGROUND OF THE INVENTION (a) Field of the Invention

The present invention relates to a commutator adapted for use in alternators of cars, more particularly to a commutator, the components of which are secured in an improved manner to increase the structural strength thereof so as to enhance various effects thereof.

(b) Description of the Prior Art

With reference to FIG. 1, components and parts of a conventional car alternator mainly include a heat dissipating plate, a base plate, terminals, and diodes. The diodes provided on the body of the heat dissipating plate are in direct contact with the body. The terminals have conductive plates that are integrally bent and extending therefrom and that are soldered to the diodes for electrical conduction. However, in actual use, the conventional commutator heat dissipating structure has the following disadvantages:
1. The terminals are secured using screws or by press fastening. However, as the screws may easily loosen when shaken, the terminals may displace to affect smooth operation of the alternator.
2. The expansion cooling and heat transfer extension areas of the cooling fins are small and unable to achieve satisfactory heat dissipation.
3. In order to achieve insulation, securing posts used to secure the heating dissipating plate and the base plate are generally formed from plastic material and are vulnerable to breaking at the joints when subjected to a shear force, which may cause the heat dissipating plate to become detached from the base plate.
4. In general after the diodes are secured in the heat dissipating plate, they are directly protected by a top cover, however, chips inside the diodes are fragile and edges thereof may easily break, which will affect the commutation effect of the diodes.

SUMMARY OF THE INVENTION

A primary object of the present invention is to provide an improved commutator heat dissipating device for alternators to positively secure the terminal in position, to enhance the heat dissipating effect, and to strength the overall structure of the commutator.

The present invention provides the following advantages in various aspects:
1. For manufacturers, faulty products due to bad structural design can be avoided. The present invention helps speed up production to meet customers' demands and to enhance market competitiveness.
2. For customers, the present invention provides a practical commutator with good adaptability. Besides, they need not worry about faulty products or stock.
3. For end users, the present invention does not require frequent replacement, maintenance or repair. Costs can therefore be reduced.

According to the present invention, a preferred embodiment of an improved commutator heat dissipating device includes An improved commutator heat dissipating device for alternators, the commutator including a heat dissipating plate, a base plate, a top cover, terminals, and diodes. The heat dissipating plate has a body including a plurality of recesses for receiving the diodes and a plurality of integrally connected wavy cooling fins on an opposite side thereof. An insulation plate is disposed between a bottom side of the body and the base plate. Securing posts pass through through holes in the heat dissipating plate to secure the heat dissipating plate and the base plate. The terminals include insulating elements and conductive plates. The insulating elements are capable of positioning the terminals by means of limiting blocks and posts of the heat dissipating plate to enable the conductive plates to be soldered with the diodes. The commutator has excellent heat dissipating effects and enhanced structural strength to achieve smooth operation of machine elements.

BRIEF DESCRIPTION OF THE DRAWINGS

The foregoing and other features and advantages of the present invention will be more clearly understood from the following detailed description and the accompanying drawings, in which.

DETAILED DESCRIPTION OF THE PREFERRED EMBODIMENT

Figure 1:
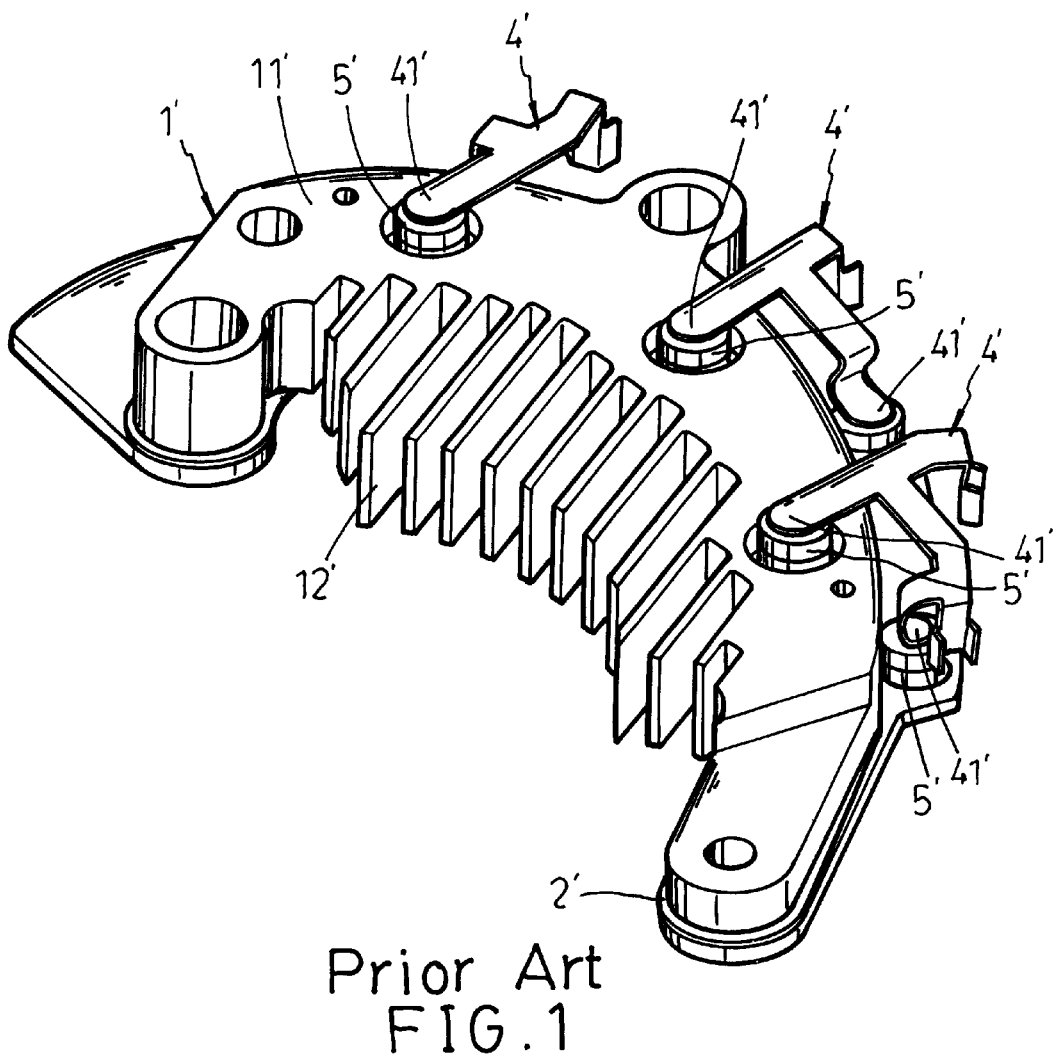
FIG. 1 is a perspective view of a conventional alternator.
Figure 2:
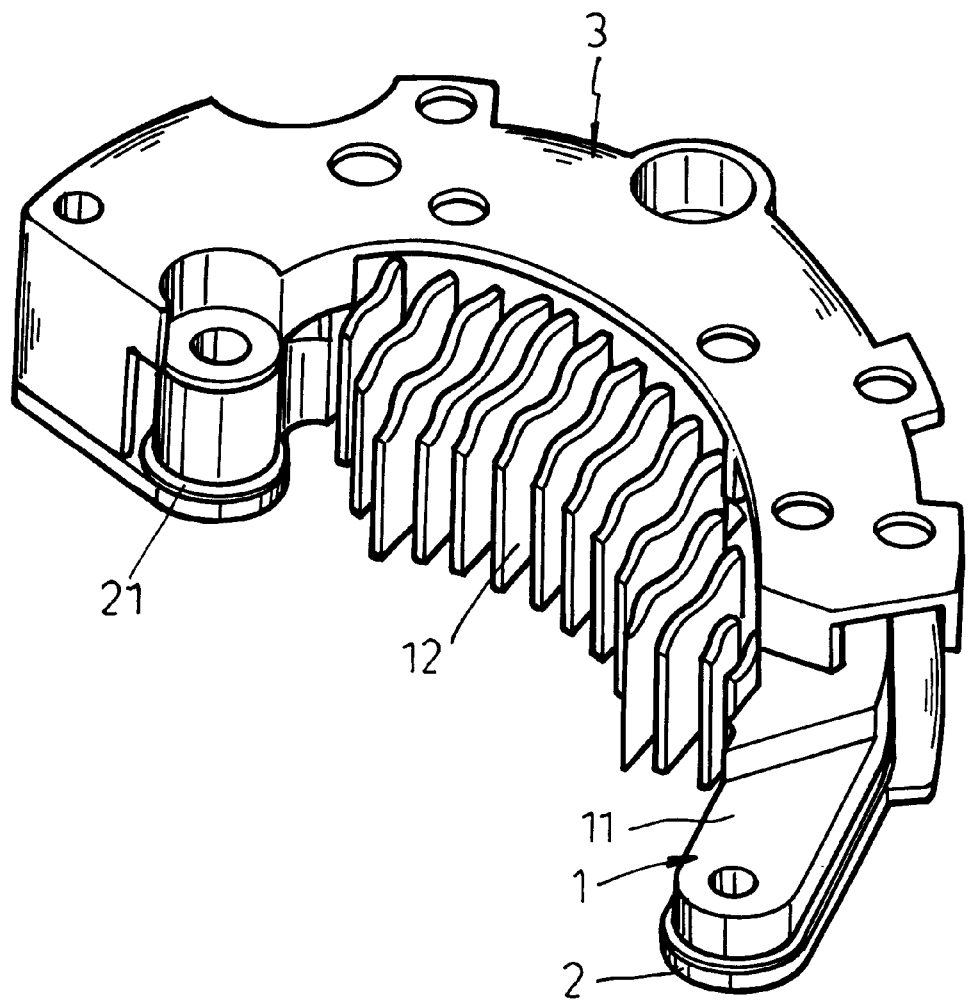
FIG. 2 is a perspective view of the a preferred embodiment of the present invention.
Figure 3:
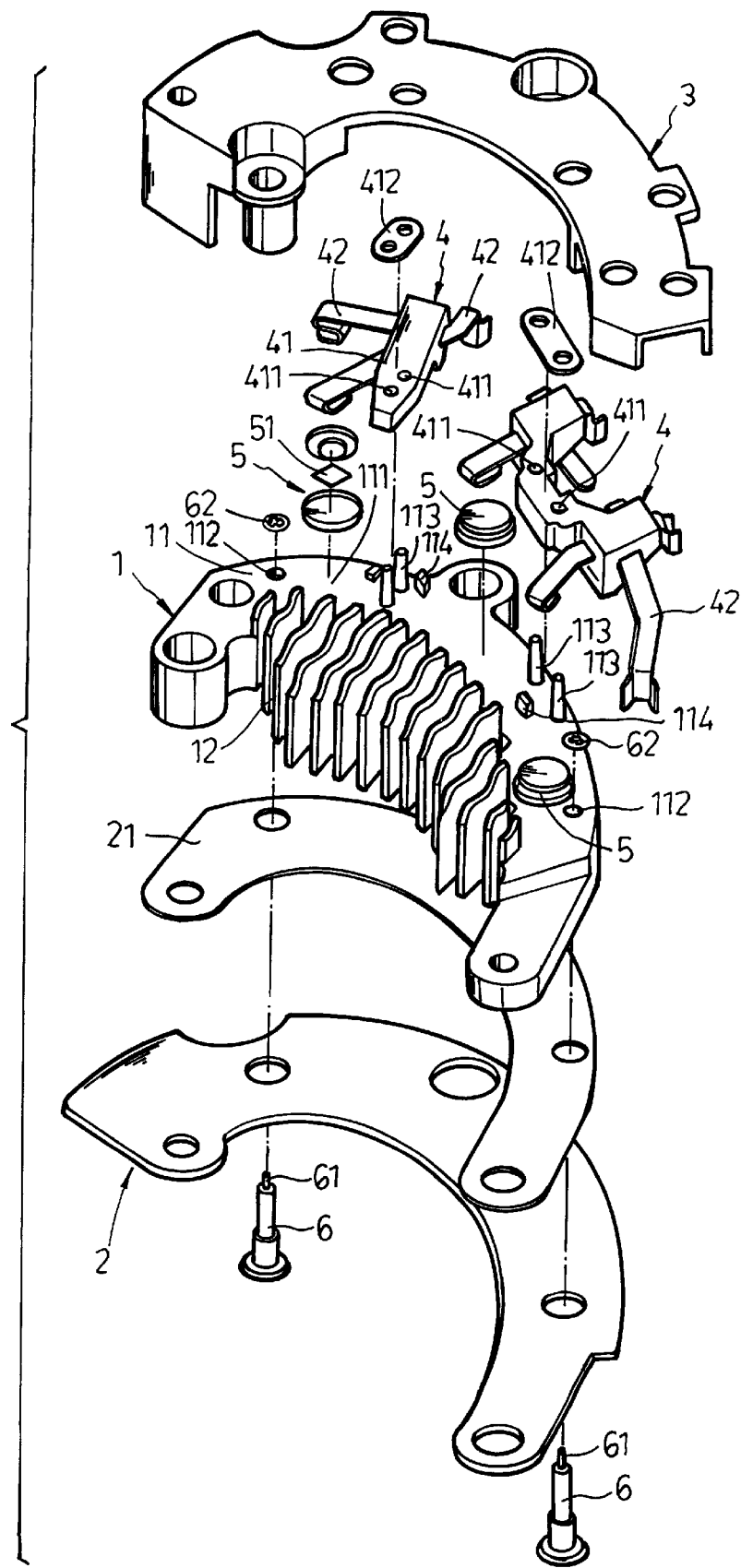
FIG. 3 is an exploded perspective view of the preferred embodiment.
Figure 4:
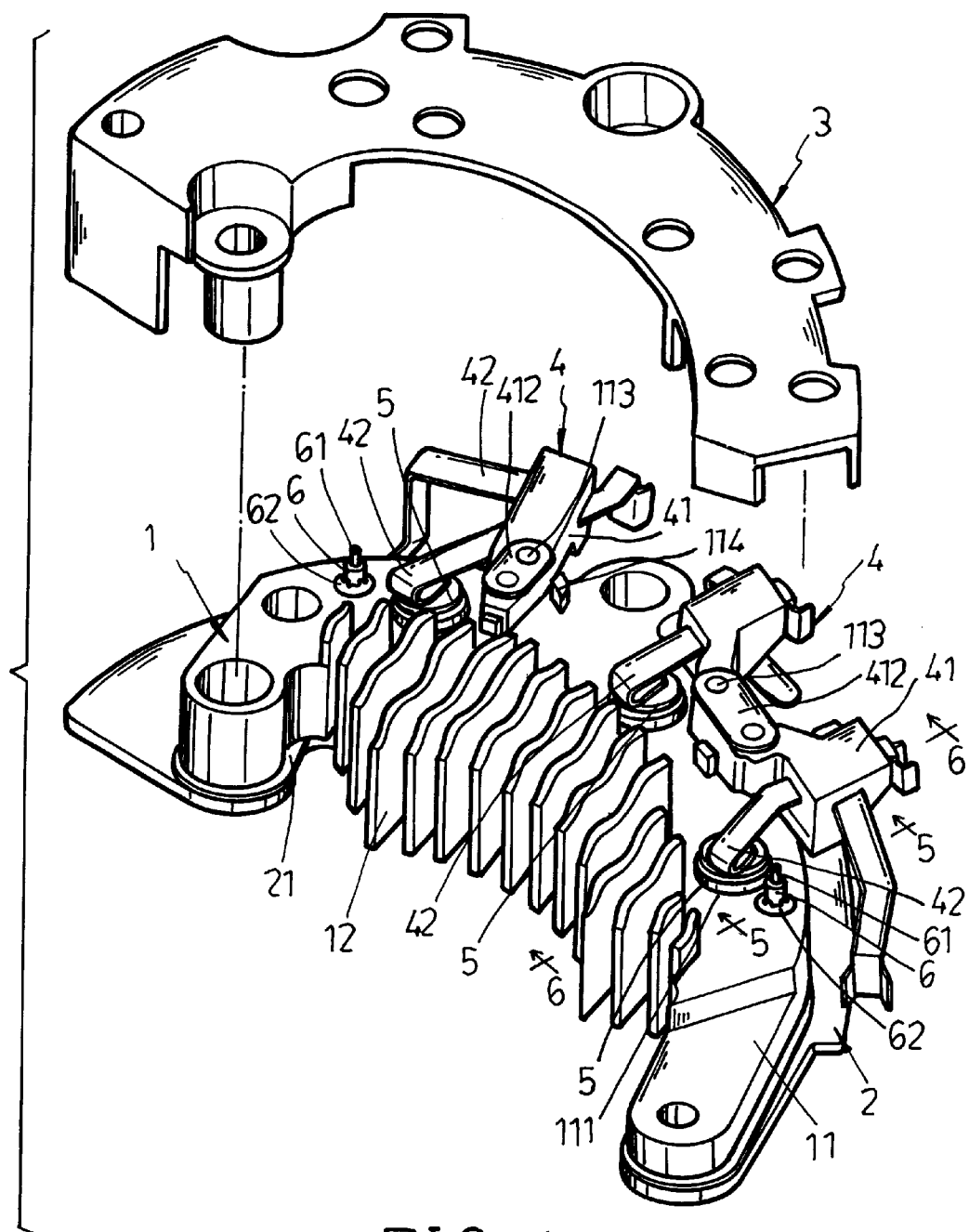
FIG. 4 is an assembled perspective view of the preferred embodiment.
Figure 5:
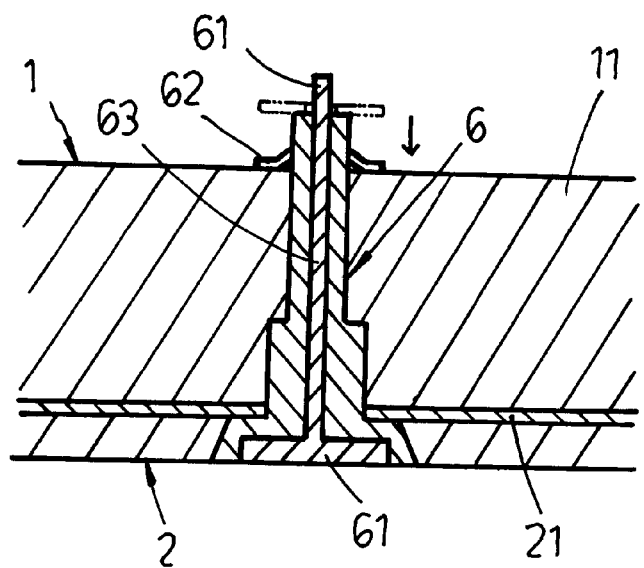
FIG. 5 is a sectional view taken along line 5—5 of FIG. 4.
Figure 6:
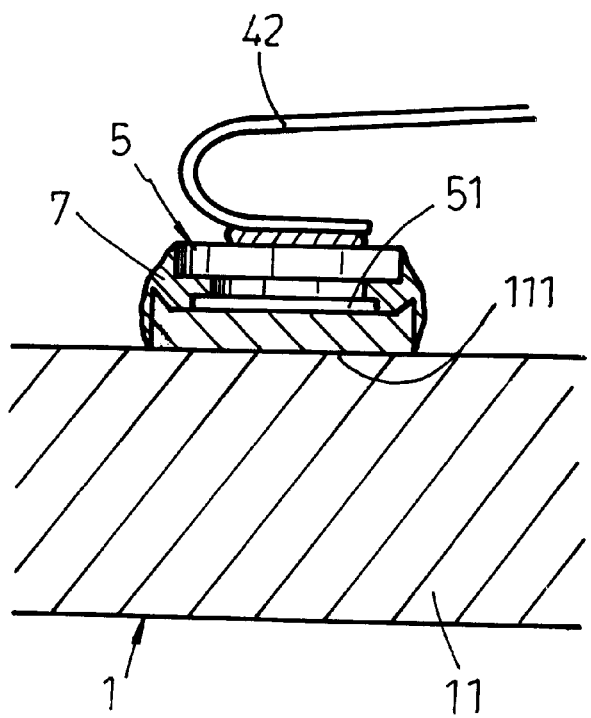
FIG. 6 is a sectional view taken along line 6—6 of FIG. 4.

With reference to FIGS. 2 to 4, a preferred embodiment of a heat dissipating device according to the present invention is shown to include a heat dissipating plate 1, a base plate 2, a top cover 3, terminals 4, diodes 5, and securing posts 6. The heat dissipating plate 1 includes a body 11 and cooling fins 12. The cooling fins 12 have a height that is greater than that of the body 11. The cooling fins 12 as a whole are configured to be wavy to enhance cooling effects. An insulating plate 21 is disposed at a bottom end of the heat dissipating plate 1, and the securing posts 6 are used to secure the base plate 2 to the bottom of the heat dissipating plate 1 via the insulating plate 21. The securing posts 6 pass from a lower side of the base plate 2 upwardly through through holes 112 in the body 11 such that upper ends thereof project from the through holes 112 of the body 11. An elastic press plate 62 is fitted over the top end of each of the securing posts 6 to exert a downward clamping force thereon so that the heat dissipating plate 1 and the base plate 2 can be tightly coupled. Unlike the prior art in which supporting rods of plastic securing posts may easily break at a joint with the securing plate when subjected to a shear force, the securing posts 6 in the present invention are internally provided with a metallic support element 61 (see FIG. 5). The support element 61 extends upwardly from a lower end of the securing post 6 to project from the upper end of the securing post 6 to prevent the securing post 6 from breaking, thereby avoiding detachment of the base plate 2 from the heat dissipating plate 1.

The body 11 of the above-mentioned heat dissipating plate 1 is provided with a plurality of recesses 111 for accommodating the diodes 5. Each diode 5 contains a chip 51. The chip 51 has a bottom face in direct contact with the body 11, and a top face soldered to a conductive plate of the terminal 4. Since all the four edges of the chip 51 project from the recess 111, it will easily break if left unprotected.

Hence, an insulation glue 7 may be poured into the recess 111 to bond the diode 5 and the conductive plate 42 of the terminal 4 connected thereto, thereby enabling the diode 5 to have a good commutation effect.

The body 11 is further provided with posts 113 and limiting blocks 114. The posts 113 are inserted into through holes 411 of an insulating element 41 of the terminal 4. A limiting block 412 is disposed at a top end of each post 113 and riveted in position so that the posts 113 and the terminal 4 can be tightly coupled. In addition the limiting block 114 located to one side of the posts 113 is adapted to limit and secure the terminal 4 in position so that the terminal 4 will not displace or slip to cause poor contact.

Although the present invention has been illustrated and described with reference to the preferred embodiment thereof, it should be understood that it is in no way limited to the details of such embodiment but is capable of numerous modifications within the scope of the appended claims.

What is claimed is:

1. An improved commutator heat dissipating device for alternators, said commutator comprising a heat dissipating plate, a base plate, a top cover, terminals, and diodes, wherein said heat dissipating plate having a body that includes a plurality of recesses for receiving said diodes, and a plurality of integrally connected wavy cooling fins on an opposite side thereof, an insulation plate being disposed between a bottom side of said body and said base plate, securing posts passing through through holes in said heat dissipating plate to secure said heat dissipating plate and said base plate, said terminals including insulating elements and conductive plates, said insulating elements being capable of positioning said terminals by means of limiting blocks and posts of said heat dissipating plate to enable said conductive plates to be soldered with said diodes, whereby said commutator has excellent heat dissipating effects and enhanced structural strength to achieve smooth operation of machine elements.

2. An improved commutator heat dissipating device for alternators as defined in claim 1, wherein said securing posts are internally provided with upwardly extending metallic support elements to avoid possible breaking thereof when subjected to a shear force.

3. An improved commutator heat dissipating device for alternators as defined in claim 1, wherein a glue may be poured around said diodes after said diodes have been secured so as to protect chips.

* * * * *